(12) United States Patent
Kumar et al.

(10) Patent No.: US 7,943,527 B2
(45) Date of Patent: May 17, 2011

(54) SURFACE PREPARATION FOR THIN FILM GROWTH BY ENHANCED NUCLEATION

(75) Inventors: Navneet Kumar, Urbana, IL (US);
Angel Yanguas-Gil, Urbana, IL (US);
Gregory S. Girolami, Urbana, IL (US);
John R. Abelson, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 199 days.

(21) Appl. No.: 12/469,973

(22) Filed: May 21, 2009

(65) Prior Publication Data
US 2010/0048029 A1    Feb. 25, 2010

Related U.S. Application Data

(60) Provisional application No. 61/057,368, filed on May 30, 2008.

(51) Int. Cl.
*H01L 21/31* (2006.01)
(52) U.S. Cl. .................................. 438/758; 438/677
(58) Field of Classification Search .................. 438/677, 438/758
See application file for complete search history.

(56) References Cited

U.S. PATENT DOCUMENTS

| | | | |
|---|---|---|---|
| 5,011,794 A | 4/1991 | Grim et al. | |
| 5,915,196 A | 6/1999 | Mineji | |
| 6,051,483 A | 4/2000 | Lee et al. | |
| 6,136,388 A | 10/2000 | Raoux et al. | |
| 6,537,905 B1 | 3/2003 | Chen et al. | |
| 6,566,159 B2 * | 5/2003 | Sawada et al. | 438/57 |
| 6,605,549 B2 | 8/2003 | Leu et al. | |
| 6,613,695 B2 | 9/2003 | Pomarede et al. | |
| 6,638,859 B2 | 10/2003 | Sneh et al. | |
| 6,676,756 B1 | 1/2004 | Li et al. | |
| 6,787,481 B2 | 9/2004 | Asai et al. | |
| 6,787,483 B1 | 9/2004 | Bayman et al. | |
| 6,790,734 B2 | 9/2004 | Kohno et al. | |
| 6,821,825 B2 | 11/2004 | Todd et al. | |
| 6,846,745 B1 | 1/2005 | Papasouliotis et al. | |
| 6,900,115 B2 | 5/2005 | Todd | |
| 6,903,031 B2 | 6/2005 | Karim et al. | |

(Continued)

FOREIGN PATENT DOCUMENTS
WO    WO 2008/127935    10/2008

OTHER PUBLICATIONS

Ahmed et al. (Mar. 2000) "CVD Diamond: Controlling Structure and Morphology," *Vacuum* 56(3):153-158.

(Continued)

*Primary Examiner* — Thao P. Le
(74) *Attorney, Agent, or Firm* — Greenlee Sullivan P.C.

(57) ABSTRACT

Various processes and related systems are provided for making structures on substrate surfaces. Disclosed are methods of making a structure supported by a substrate by providing a substrate having a receiving surface and exposing at least a portion of the receiving surface to output from a remote plasma of an inert gas. The remote plasma has an energy low enough to substantially avoid etching or sputtering of the receiving surface but sufficient to generate a treated receiving surface. The treated surface is contacted with a deposition gas, thereby making the structure supported by the substrate.

31 Claims, 7 Drawing Sheets

U.S. PATENT DOCUMENTS

| | | | |
|---|---|---|---|
| 6,946,597 B2 * | 9/2005 | Sager et al. | 136/263 |
| 6,958,253 B2 | 10/2005 | Todd | |
| 6,958,277 B2 | 10/2005 | Pomarede et al. | |
| 6,962,859 B2 | 11/2005 | Todd et al. | |
| 7,037,574 B2 | 5/2006 | Paranjpe et al. | |
| 7,056,835 B2 * | 6/2006 | Pomarede et al. | 438/769 |
| 7,071,118 B2 | 7/2006 | Kools et al. | |
| 7,106,663 B2 | 9/2006 | Nagatsuka | |
| 7,139,977 B1 | 11/2006 | Russell | |
| 7,202,166 B2 | 4/2007 | Wilk | |
| 7,229,859 B2 | 6/2007 | Yudasaka et al. | |
| 7,229,931 B2 | 6/2007 | Mungekar et al. | |
| 7,235,484 B2 | 6/2007 | Nguyen et al. | |
| 7,235,495 B2 | 6/2007 | Wagener | |
| 7,241,701 B2 | 7/2007 | Dotsikas | |
| 7,285,500 B2 | 10/2007 | Todd et al. | |
| 7,294,553 B2 | 11/2007 | Vogt | |
| 7,303,991 B2 | 12/2007 | Sarigiannis et al. | |
| 7,312,163 B2 | 12/2007 | Derderian et al. | |
| 7,314,835 B2 * | 1/2008 | Ishizaka et al. | 438/758 |
| 7,592,254 B2 | 9/2009 | Abelson et al. | |
| 7,618,902 B2 * | 11/2009 | Triyoso et al. | 438/778 |
| 2002/0059726 A1 * | 5/2002 | Sawada et al. | 29/890.033 |
| 2005/0181534 A1 * | 8/2005 | Yoshimi et al. | 438/96 |
| 2007/0111521 A1 * | 5/2007 | Wilk | 438/680 |
| 2007/0141779 A1 | 6/2007 | Abelson et al. | |
| 2008/0092953 A1 * | 4/2008 | Lee | 136/261 |
| 2009/0098343 A1 | 4/2009 | Arena et al. | |
| 2009/0203197 A1 * | 8/2009 | Hanawa et al. | 438/513 |
| 2009/0315030 A1 * | 12/2009 | Choi et al. | 257/53 |
| 2010/0104770 A1 * | 4/2010 | Goundar | 427/569 |
| 2010/0168404 A1 | 7/2010 | Girolami et al. | |

OTHER PUBLICATIONS

Aron et al. (Oct. 1, 1982) "Some Properties of r.f.-Sputtered Hafnium Nitride Coatings," *Thin Solid Films* 96(1):87-91.

Baker et al. (1997) "Combined X-Ray Photoelectron/Auger Electron Spectroscopy/Glancing Angle X-Ray Diffraction/Extended X-ray Adsorption Fine Structure Investigation of $TiB_xN_y$ Coatings," *J. Vac. Sci. Technol. A. Vac. Surf. Films* 15(2):284-291.

Bultel et al. (Mar. 25, 2002) "Influence of $Ar_2^+$ in an Argon Collisional Radioactive Model," *Phys. Rev. E* 65(4):046406.

Chaara et al. (1994) "MOCDV TiN from TDEAT and Ammonia: Experiments and Simulations," In; *Advanced Metallization for ULSI Applications in 1993*, Y. Shacham, D. Favreauand Y. Horiike, eds., MRS, 1994, pp. 159-166.

Cote et al. (1999) "Plasma-Assisted Chemical Vapor Deposition of Dielectric Thin Films for ULSI Semiconductor Circuits," *IBM J. Res. Dev.* 43:5-38.

Crowell, J.E. (Sep. 2003) "Chemical Methods of Thin Film Deposition: Chemical Vapor Deposition, Atomic Layer Deposition, and Related Technologies," *J. Vac. Sci. Technol. A* 21(5):S88-S95.

Dresser et al. (Aug. 1, 1989) "The Adsorption and Decomposition of $NH_3$ on Si(100)-Detection of the $NH_2(a)$ Species," *Surf. Sci.* 218(1):75-107.

Fehsenfeld et al. (Mar. 1965) "Microwave Discharge Cavities Operating at 2450 MHz," *Rev. Sci Instrum.* 36(3):294-298.

Fix et al. (Nov. 1991) "Chemical Vapor Deposition of Titanium, Zirconium, and Hafnium Nitride Thin Films," *Chem. Mater.* 3(6):1138-1148.

George et al. (2010) "Atomic Layer Deposition: An Overview," *Chem. Rev.* 110(1):111-131.

Gissler et al. (Jul. 1994) "Preparation and Characterization of Cubic Boron Nitride and Metal Boron Nitride Films," *Surf. Interface Anal.* 22:139-148.

Gordon et al. (2003) "A Kinetic Model for Step Coverage by Atomic Layer Deposition in Narrow Holes or Trenches," *Chem. Vapor Depos.* 9(2):73-78.

Han et al. (2005) "Advanced Al Damascene Process for Fine Trench Under 70nm Design Rule," *Mater. Res. Soc. Symp. Proc.* 863:B8.23.1-B8.23.6.

Heitzinger et al. (Mar. 2003) "Simulation of Arsenic In Situ Doping With Polysilicon CVD and Its Applications to High Aspect Ratio Trenches," *IEEE Tran. Aided Design.* 22(3):285-292.

Hofmann, S. (1991) "Compositional Depth by Sputtering," *Prog. Surf. Sci.* 36(1):35-87.

Hoffman, D.M. (Apr. 1994) "Chemical Vapour Deposition of Nitride Thin Films," *Polyhedron* 13(8):1169-1179.

Holzschuh, H. (Dec. 22, 2004) "Deposition of Ti-B-N (Single and Multilayer) and Zr-B-N Coatings by Chemical Vapor Deposition Techniques on Cutting Tools," *Thin Solid Films* 469-470:92-98.

Islamraja et al. (1991) "A 3-Dimensional Model for Low-Pressure Chemical-Vapor-Deposition Step Coverage in Trenches and Circular Vias," *J. Appl. Phys.* 70:7137.

Jayaraman et al. (2005) "Chromium Diboride Thin Films by Low Temperature Chemical Vapor Deposition," *J. Vac. Sci Technol.* 23:631-633.

Jayaraman et al. (2005) "Hafnium Diboride Thin Films by Chemical Vapor Deposition from a Single Source Precursor," *J. Vac. Sci. Technol. A.* 23(6):1619-1625.

Jayaraman et al. (Jun. 20, 2006) "$HfB_2$ and Hf-B-N Hard Coatings by Chemical Vapor Deposition," *Surf. Coat. Technol.* 200:6629-6633.

Jellison et al. (1996) "Parameterization of the Optical Functions of Amorphous Materials in the Interband Region," *Appl. Phys. Lett.* 69(3):371-373.

Johansson et al. (1984) "Structure of Reactively Magnetron Sputtered Hf-N Films," *Appl. Phys. Lett.* 44(7):670-672.

Kajikawa et al. (May 30, 2005) "Growth Mode During Initial Stage of Chemical Vapor Deposition," *Appl. Surf. Sci.* 245(1-4):281-289.

Kim, H. (Feb. 24, 2006) "The Application of Atomic Layer Deposition for Metallization of 65 nm and Beyond," *Surf. Coat. Technol.* 200(10):3104-3111.

Kim, H. (Nov. 2003) "Atomic Layer Deposition of Metal and Nitride Thin Films: Current Research Efforts and Applications for Semiconductor Device Processing," *J. Vac. Sci Technol. B* 21(6):2231-2261.

Klaus et al. (Jul. 2000) "SiO2 Chemical Vapor Deposition at Room Temperature Using $SiCl_4$ and $H_2O$ with an $NH_3$ Catalyst," *J. Electrochem. Soc.* 147(7):2658-2664.

Koh et al. (Aug. 26, 1996) "Correlation of Real Time Spectroellipsometry and Atomic Force Microscopy Measurements of Surface Roughness on Amorphous Semiconductor Thin Films," *Appl. Phys. Lett.* 69(9):1297-1299.

Kuech et al. (1991) "Selective Epitaxy of GaAs, $Al_xGa_{1-x}As$, and $In_xGa_{1-x}As$," *J. Cryst. Growth* 107:116-128.

Kumar et al. (2008) "Growth Inhibition to Enhance Conformal Coverage in Thin Film Chemical Vapor Deposition," *J. Am. Chem. Soc.* 130:17660-17661.

Kumar et al. (2009) "Low Temperature Chemical Vapor Deposition of Hafnium Nitride-Boron Nitride Nanocomposite Films," *Chem. Mater.* 21:5601-5606.

Kumar et al. (2009) "Remote Plasma Treatment of Si Surfaces: Enhanced Nucleation in Low-Temperature Chemical Vapor Deposition," *Appl. Phys. Lett.* 95(14):144107.

Kurahashi et al. (May 20, 2000) "Observation of $H^+$Desorption Stimulated by the Impact of Metastable Helium Atoms," *Surf. Sci.* 454-456:300-304.

Lim et al. (Mar. 22, 2005) "Enhancement of Ru Nucleation by Pretreatments of the Underlying TaSin Film Surface in Ru MOCDV," *Thin Solid Films* 475(1-2):194-197.

Lim et al. (2003) "Atomic Layer Deposition of Transition Metals," *Nat. Mater.* 2:749-754.

Macko et al. (2004) "Determination of the Non-Relaxation (Reflection) Probability of Metastable $Ar(^3P_2)$ Atoms on a Pyrex Surface," *Plasma Surf. Sci. Technol.* 13(2):303-308.

McCarrol (Feb. 1969) "An Improved Microwave Discharge Cavity for 2450MHz," *Rev. Sci. Instrum.* 41(2):279-280.

Mitsui et al. (1999) "Selective Nanoscale Growth of Titanium on the SI (001) Surface Using an Atomic Hydrogen Resist," *J. Appl. Phys.* 86(3):1676-1679.

Moisan et al. (1979) "The Theory and Characteristics of an Efficient Surface Wave Launcher (Surfatron) Producing Long Plasma Columns," *J. Phys. D Appl. Phys.* 12(2):219.

Neeser et al. (1997) "A Kinetic Model for the Formation of $Ar_2$ Excimers," *J. Phys. D. Appl. Phys.* 30(10):1489-1498.

Nguyen, S.V. (1999) "High-Density Plasma Chemical Vapor Deposition of Silicon-Based Dielectric Films for Integrated Circuits," *IBM J. Res. Dev.* 43:109.

Nuruddin et al. (1994) "Surface Reaction Probability in Hydrogenated Amorphous Silicon Growth," *J. Appl. Phys.* 76:3123-3129.

Okada et al. (1999) "Adsorption and Desorption Kinetics of Tetrakis(dimethylamino)titanium and Dimethylamine on TiN Surfaces," *Appl. Surf. Sci.* 137:113-124.

Okorn-Schmidt, H.F. (May 1999) "Characterization of Silicon Surface Preparation Processes for Advanced Gate Dielectrics," *IBM J. Res. Dev.* 43(3):351-365.

Panayiotatos et al. (2003) "Homogeneous and Amorphous Sputtered $sp^3$-Bonded BN Films at RT: A Stress, Spectroscopic Ellipsometry and XPS Study," *Diamond Relat. Mater.* 12:1151-1156.

Perry et al. (Dec. 1985) "An XPS Study of Hafnium Nitride Films," *Solid State Commun.* 56(10):837-841.

Perry et al. (Apr. 1987) "Non-Stoichiometry Effects in the XPS Spectra of HfN Films," *Solid State Commun.* 62(1):23-26.

Peytavy et al. (Jan. 1979) "A Study of Some Properties of Titanium Boronitride Used for the Coating of Cutting Tools," *Wear* 52(1):89-94.

Pusel et al. (Aug. 2, 1999) "Time-of-Flight Analysis and Modeling of Photochemical Hydrogen Desorption from Silicon (111) with an $F_2$ Laser," *Surf. Sci.* 433-435:74-78.

Puurunen et al. (Dec. 15, 2004) "Island Growth as a Growth Mode in Atomic Layer Deposition: A Phenomenological Model," *J. Appl. Phys.* 96(12):7686-7695.

Raupp et al. (1993) "The Impact of Gas Phase and Surface Chemical Reactions on Step Coverage in Lpcvd," *MRS Proc.* 334:471.

Rossnagel, S.M. (Sep. 1998) "Directional and Ionized Physical Vapor Deposition for Microelectronics Applications," *J. Vac. Sci. Technol. B.* 16(5):2585-2608.

Rossnagel, S.M. (Jan./Mar. 1999) "Sputter Deposition for Semiconducting Manufacturing," *IBM J. Res. Dev.* 43(1/2):163-179.

Saraswat et al. (Oct. 1984) "Selective CVD of Tungsten for VSLI Technology," *J. Electrochem. Soc.* 131:C86 (abstract).

Satta et al. (Dec. 15, 2002) "Growth Mechanism and Continuity of Atomic Layer Deposited TiN Films on Thermal $SiO_2$," *J. Appl. Phys.* 92(12):7641-7646.

Schlote et al. (1999) "$SiO_2$ Films from Tatraethoxysilane-Based LPCDV: An Experimental Investigation of the By-Product-Inhibited Deposition Mechanism," *J. Electrochem. Soc.* 146(9):3415-3419.

Schmid et al. (1998) "Optical and Electronic Properties of Sputtered $TiN_X$ Thin Films," *J. Vac. Sci. Technol. A Vac. Surf. Films* 16(5):2870-2875.

Schwarz-Selinger et al. (Jan. 2001) "Quantification of a Radical Beam Source for Methyl Radicals," *J. Vac. Sci. Technol. A* 19(1):101-107.

Sesselmann et al. (Feb. 1, 1987) "Interaction of Metastable Noble-Gas Atoms with Transition-Metal Surfaces: Resonance Ionization and Auger Neutralization," *Phys. Rev. B* 35(4):1547-1559.

Sesselmann et al. (Feb. 7, 1983) "Probing the Local Density of States of Metal Surfaces by Deexcitation of Metastable Noble-Gas Atoms," *Phys. Rev. Lett.* 50(6):446-450.

Shacham-Diamond, Y. (2001) "Barrier Layers for Cu ULSI Metallization," *J. Electron. Mater.* 30(4):336-344.

Shen et al. (Nov. 18, 1997) "Electron Stimulated Desorption Induced by the Scanning Tunneling Microscope," *Surf. Sci.* 390(1-3):35-44.

Shim et al. (2002) "Bottom-up Filling Submicrometer Features in Catalyst-Enhanced Chemical Vapor Deposition of Copper," *J. Electrochem Soc.* 149(2):G109-G113.

Singh et al. (1993) "Effect of Surface Re-Emission on the Surface Roughness of Film Growth in Low Pressure Chemical Vapor Deposition," *J. Vac. Sci. Technol. A. Vac. Surf. Films* 11(3):557-568.

Smith, F.T. (Sep. 1970) "Structure and Electrical Properties of Sputtered Films of Hafnium and Hafnium Compounds," *J. Appl. Phys.* 41(10):4227.

Sperling et al. (Oct. 18, 2004) "Simultaneous Short-Range Smoothing and Global Roughening During Growth of Hydrogenated Amorphous Silicon Films," *Appl. Phys. Lett.* 85(16):3456-3458.

Takenaka et al. (Jul. 2004) "Anisotropic Deposition of Cu in Trenches by H-Assisted Plasma Chemical Vapor Deposition," *J. Vac. Sci. Technol. A* 22(4):1903-1907.

Tauc et al. (1966) "Optical Properties and Electronic Structure of Amorphous Germanium," *Phys. Status Solidi* 15(2):627-637.

Tschersich et al. (Oct. 15, 1998) "Formation of an Atomic Hydrogen Beam by a Hot Capillary," *J. Appl. Phys.* 84:4065.

Vereecken et al. (Jan. 2005) "The Chemistry of Additives in Damascene Copper Plating," *IBM J. Res. Dev.* 49:3-18.

Wantanabe et al. (Web Release May 23, 2004) "Direct-Bandgap Properties and Evidence for Ultraviolet Lasing of Hexagonal Boron Nitride Single Crystal," *Nat. Mater.* 3:404-409.

Weiller et al. (1995) "$HNMe_2$ Inhibits the Reaction of $Ti(NMe_2)_4$ with $NH_3$: Implications for the Chemical Vapor Deposition of TiN and Related Nitrides," *Chem. Mater.* 7(9):1609-1611.

Weiller et al. (Mar. 1997) "Effect of Dimethylamine on the Chemical Vapor Deposition of TiN from Tetrakis(dimethylamido)titanium and Ammonia," *J. Electrochem. Soc.* 144(3):L40-L43.

Williams, W.S. (1997) "Transition Metal Carbides, Nitrides and Borides for Electronic Applications," *JOM J. Miner. Metal Mater. Soc.* 49(3):38-42.

Wulu et al. (1991) "Simulation of Mass Transport for Deposition in Via Holes and Trenches," *J. Electrochem. Soc.* 138(6):1831-1840.

Yamauchi et al. (Mar. 20, 2003) "Metastable-Atom-Stimulated Desorption from Hydrogen-Passivated Silicon Surfaces," *Surf. Sci.* 528(1-3):91-96.

Yang et al. (Web Release Sep. 19, 2006) "CVD Growth Kinetics of $HfB_2$ Thin Films from the Single-Source Precursor $Hf(BH_4)_4$," *Chem. Mater.* 18:5088-5096.

Yang et al. (2007) "In situ Spectroscopic Ellipsometry Analyses of Hafnium Diboride Thin Films Deposited by Single-Source Chemical Vapor Deposition," *J. Vac. Sci. Technol. A* 25(1):200-206.

Yang et al. (Sep. 4, 2006) "Crystalline Texture in Hafnium Diboride Thin Films Grown by Chemical Vapor Deposition," *J. Cryst. Growth* 294(2):389-395.

Yanguas-Gil et al. (2009) "Highly Conformable Film Growth by Chemical Vapor Deposition. I. A Conformal Zone Diagram Based on Kinetics," *J. Vac. Sci. Technol. A* 27(5):1235-1243.

Yanguas-Gil et al. (2009) "Highly Conformal Film Growth by Chemical Vapor Deposition. II. Conformality Enhancement Through Growth Inhibition," *J. Vac. Sci. Technol. A* 27(5):1244-1248.

Yee et al. (1986) "Reactive Radio Frequency Sputter Deposition of Higher Nitrides of Titanium, Zirconium, and Hafnium," *J. Vac. Sci. Technol. A. Vac. Surf. Films* 4(3):381-387.

Zerr et al. (Web Release Feb. 23, 2003) "Synthesis of Cubic Zirconium and Hafnium Nitride Having $Th_3P_4$ Structure," *Nat. Mater.* 2:185-189.

Zhao et al. (Sep. 24, 2001) "Morphology Transition During Low-Pressure Chemical Vapor Deposition," *Phys. Rev. Lett.* 87:136102.

Zunger et al. (Jun. 15, 1976) "Optical Properties of Hexagonal Boron Nitride," *Phys. Rev. B* 13(12):5560-5573.

\* cited by examiner

FIG. 8

# SURFACE PREPARATION FOR THIN FILM GROWTH BY ENHANCED NUCLEATION

CROSS-REFERENCE TO RELATED APPLICATIONS

This application claims the benefit of U.S. provisional application 61/057,368 filed May 30, 2008, which is incorporated by reference in its entirety to the extent not inconsistent with the disclosure herein.

BACKGROUND OF THE INVENTION

Processes and systems provided herein generally relate to the field of material deposition. In particular, disclosed processes and systems provide for effective nucleation of thin films useful in various deposition techniques that grow material on a substrate to access formation of smooth and uniform thin films which may be used in microelectronics, MEMS, and other technologies.

Chemical vapor deposition (CVD) is a common technique for depositing thin films for various applications including integrated circuits, MEMS, and hard coatings. Atomic layer deposition (ALD) is another such technique, which has the capability to deposit highly conformal and uniform coatings of controlled thickness. Both of these processes begin with a nucleation step, which involves the formation of clusters of atoms of the material to be deposited onto the substrate surface. Very frequently, poor nucleation is a problem associated with these two deposition techniques. The ease of nucleation determines the film smoothness, microstructure and other properties in the later stages of film growth. For example, if nucleation is sparse, islands form on the surface and film continuity is not achieved until the layer is relatively thick. To synthesize continuous films of low thickness, the nucleation should be dense so as to avoid the existence of substrate surface with no nuclei present. On the other hand, it is important the treatment not modify the surface by sputtering, chemical reaction, etching or the like.

Reactive plasma exposure like $O_2$, $N_2$, $NH_3$, $H_2$ or halogen (F, Cl, B, I)-based gas have been used to pretreat a substrate surface prior to CVD or ALD (see U.S. Pat. Nos. 6,605,549, 6,638,859, 6,613,695). Those treatments, however, rely on reactive gases or radicals of these gases generated from the plasma, and thereby have attendant reconfiguration of surfaces. In either case, the idea is to change the surface termination from the initial state to either —OH, N, $NH_2$ or —X terminated state, X being a halogen. This termination makes the surface more reactive to CVD/ALD precursors. Once the surface termination has changed, the CVD or ALD precursor adsorbs and reacts better on these terminations thus rendering better nucleation characteristics. That process, however, suffers from a limitation related to an interface between the film and the surface that is no longer pristine. Instead, the surface contains an additional layer of foreign atoms, which might be disadvantageous with regard to an electrical, optical and/or magnetic property of a system in which the processed surface is incorporated.

Another reported method for providing surface activation is by high-energy ion bombardment of the substrate to create defects on its surface. For example, Lim et al. (Thin Solid Films Vol. 475, p. 194) use Ar plasma exposure pretreatment to enhance nucleation of Ruthenium on a TaSiN surface. That idea, however, is based on bombarding the surface with high energy $Ar^+$ ions, thereby etching it. Some researchers have also tried biasing the substrate to produce higher energy ion bombardment to enhance nucleation on the substrates. Such energetic pretreatment methods are not desirable in most thin film applications as they cause unwanted chemical or physical interactions with the surface, thereby interfering with functionality or adversely impacting layer geometry.

U.S. Pat. No. 6,613,695 relates to surface preparation prior to depositing a layer on the surface in an attempt to more readily nucleate poly-silicon and poly-SiGe or to more readily adsorbs ALD reactants. That process, however, pretreats by introducing relatively high energy F, Cl, H or N radicals produced by plasma product treatment. Accordingly, the surface treatment causes a change in the surface termination of the substrate to facilitate subsequent deposition. Such a change in surface termini can adversely impact desired functions and characteristics of the end system in which the processed substrate is incorporated.

Layer uniformity can become particularly problematic in conventional processing techniques used to make ultrathin layers (e.g., ultrathin gate oxides) in the less than 10 nm range. Films of such thicknesses are commonly associated with unacceptably high levels of defects, such as pinholes. The defects result in leakage currents during use, rapid device breakdown and other functional defects. Accordingly, relatively simple systems and processes capable of accessing relatively uniform and thin structures, such as thin films supported by a substrate, are needed.

SUMMARY OF THE INVENTION

The processes provided herein yield superior film growth via enhanced nucleation and rely on the use of activated species of relatively low energy to achieve good nucleation without sputtering or otherwise damaging or degrading the surface. In this manner, uniform structures that are relatively thin can be reliably achieved, including thin films that are supported by an underlying receiving surface, without significantly impacting the surface as often occurs during conventional processing techniques including pretreatment processing. Substrate activation provided by the present methods provides for generation of uniform thin films, optionally conformal thin films, having low defect levels, and thin films having useful substrate-thin film interface properties.

The processes and systems described herein activate regions of the receiving surface of the substrate by activating the surface in a manner that avoids or at least substantially avoids etching or sputtering of the surface. Examples of species capable of such surface activation include output from a remote plasma of an inert gas such as, for example, a metastable species. To minimize unwanted interaction between the species, or an other material generated directly or indirectly from the species, the current at the receiving surface attributed to the introduced species can be monitored such that the current remains below a user-selected current density. Similarly, the energy of species provided for substrate activation by the remote plasma may be selected to remain below a user-selected energy level. As used herein, "activation" refers to surface treatment so as to enhance nucleation and growth of uniform films. The treatment may be a pretreatment where activation occurs prior to material deposition. The treatment may be a treatment that occurs during deposition. The treatment may comprise both a pretreatment and a treatment during deposition. Flux, duration of exposure, temperature are examples of other variables that may be optionally selected to further control process conditions to thereby influence final structure configuration and properties.

In general, various processes provided herein facilitate methods of surface activation by treatment without sputtering or other undesirable surface or substrate chemical interaction.

The treatment affords a very high nucleation density and hence, fast coalescence during the film or structure deposition. By this treatment, in an aspect, a metal-based film on silicon is achieved that is fully coalesced of less than about 5 nm in thickness with a rms roughness less than about 1 nm. In an aspect, the treatment relates to exposing a surface to a metastable species, such as generated plasma of an inert or noble gas like argon, helium, neon, xenon and/or exposing a surface to high energy electromagnetic radiation such as photons sufficient to activate the surface, for example by photochemical and photothermal processes that remove H termination and generate dangling bonds. These species have sufficient energy to create nucleation sites on the substrate or otherwise enhance nucleation conditions but are of sufficiently low energy to not damage or remove surface atoms on the receiving surface.

Processes disclosed herein facilitate nucleation enhancement during thin film deposition following a surface treatment. The treatment involves exposure of the substrate to gaseous species (low energy ions, metastables, or electrons) and/or photons from a noble gas plasma generated outside the deposition chamber. Activation can be achieved via exposure of the surface to gaseous species (low energy ions, metastables, or electrons) and/or photons prior to thin film deposition or co-treatment via exposure of the surface to gaseous species (low energy ions, metastables, or electrons) and/or photons during thin film deposition. After or during the treatment, the substrate is exposed to the precursor molecule used in the CVD or ALD growth process. With the treatment of the substrate, the nucleation is very rapid, and fully coalesced films are achieved at a low film thickness. Without the treatment, nucleation is difficult and large islands form before coalescence is achieved. This is confirmed experimentally via atomic force microscopy (AFM) images of the film with and without treatment. With treatment, a typical roughness of a fully coalesced film has a root-mean-squared (rms) value of <7.5 Å, about three times less than for a film deposited without the treatment.

In an embodiment, the invention is a method of making a structure supported by a substrate by providing a substrate having a receiving surface and exposing at least a portion of the receiving surface to output from a remote plasma of an inert gas. In an aspect, the remote plasma has an energy low enough to avoid or substantially avoid etching or sputtering of the receiving surface. Etching refers to removal of atomic species contained in the surface. Sputtering refers to deposition of unwanted material on the surface. In an aspect the output of the remote plasma exposes the receiving surface to a current less than or equal to a user-selected current, such as less than about 100 nAmps, or a range that is between about 20 nAmps and 80 nAmps. The current is optionally further described as per unit surface area, such as the surface area of the substrate surface being processed. Although the processes provided herein are not limited to any specific substrate surface area, examples are surface areas ranging from between 100 $nm^2$ and 100 $cm^2$, so that current per unit surface area may be less than or equal to about 50 nAmps $cm^{-2}$, thereby generating a treated receiving surface. A deposition gas contacts the treated receiving surface to make the structure supported by a substrate. In an aspect, the structure is a thin film, such as films having a thickness less than about 1000 nm, 100 nm, 10 nm or 1 nm, for example.

In another embodiment, the remote plasma is a noble gas plasma, for example a plasma of He gas, Ar gas, Ne gas, Kr gas, Xe gas or any combination of these gases.

Any of the methods described herein can be further defined in terms of the energy of the remote plasma. In an embodiment, the remote plasma has an energy less than or equal to a user selected potential. Alternatively, the remote plasma has an energy selected over the range of 1 eV to 100 eV, or about 20 eV. In an embodiment, the remote plasma energy level is selected to achieve an electron energy level downstream such as in the deposition chamber of less than 1 eV, less than 0.5 eV, between 0.1 eV and 0.3 eV, or an energy level that avoids or minimizes unwanted surface substrate interactions.

In an embodiment, the remote plasma energy is selected to have a value low enough such that the output of the remote plasma is substantially not incorporated into the substrate upon the exposing step.

In another embodiment, the invention further comprises the step of removing electrons, ions or both from the output of the remote plasma. Optionally, the step of removing electrons, ions or both from the output of the remote plasma is achieved by contacting the output with a surface capable of scavenging the electrons, ions or both prior to exposure of the output to the receiving surface.

In an aspect, the output from the remote plasma provides a flux of metastable species to the receiving surface of the substrate, such as a user-selected flux. Examples of metastable species include, but are not limited to, compositions comprising excited species and/or electronically excited species. In an embodiment of this aspect, the electronically excited species are electronically excited Ar atoms, electronically excited He atoms, electronically excited Ne atoms, or clusters or combinations of these. In another embodiment, the output from the remote plasma provides a user-selected flux of radicals to the receiving surface.

In an embodiment, the receiving surface of the substrate is exposed to the output of the remote plasma for a duration, such as a duration selected over the range of 10 seconds to 10 minutes. In an embodiment, the receiving surface is provided at a temperature, such as room temperature or selected from the range of about 20° C. to 800° C. during the step of exposing at least a portion of the receiving surface of the substrate to the output from the remote plasma.

In an aspect, the substrate is provided in a deposition chamber, such as in a configuration wherein the remote plasma is provided outside of the deposition chamber. In an embodiment, the output of the plasma is provided to the deposition chamber via a conduit, such as a conduit that is a glass tube or other surface that optionally scavenges electrons, ions or both from the output of the remote plasma.

In an embodiment, the step of exposing at least a portion of the receiving surface of the substrate to output from the remote plasma generates a plurality of nucleation sites on the received surface of the substrate. In another embodiment, the step of exposing at least a portion of the receiving surface of the substrate to output from the remote plasma makes at least a portion of the receiving surface atomically clean. Alternatively, the step of exposing at least a portion of the receiving surface of the substrate to output from the remote plasma dehydrogenates at least a portion of the received surface of the substrate.

Any of the methods provided herein optionally comprise the step of passivating the receiving surface of the substrate prior to the exposing step. In an embodiment, the passivating step comprises the steps of contacting the receiving surface with HF acid and rinsing the receiving surface with deionized water.

In an aspect, the deposition gas is a chemical vapor deposition precursor gas or an atomic layer deposition precursor gas. In another aspect, the deposition gas is one or more transition metal, f-metal, or main group compounds bearing ligands of various types, including but not limited to:

hydrides, borohydrides, halides, oxides, alkoxides, hydroxides, beta-diketonates, carboxylates, siloxides, thiolates, sulfides, nitrides, amides, imides, beta-diketiminates, pyrazolates, trazolates, amidinates, nitrites, nitrates, azides, alkyls, aryls, cyclopentadienyls, ethers, sulfides, ketones, aldehydes, amines, nitriles, isonitriles, phosphines, phosphites, arsines, stibines, carbonyls, olefins, alkynes, arenes, and cyclooctatetraenes. In an exemplified embodiment, $HF(BH_4)_4$ is introduced to a receiving surface comprising silicon, although the processes are compatible with nucleation of other CVD and ALD precursor materials known in the art and/or a range of other receiving surface materials.

In an embodiment, the invention relates to specific substrates and devices made by any of the methods provided herein. In an aspect, the substrate is a semiconductor substrate, such as a semiconductor material selected from the group consisting of silicon, germanium, gallium arsenide, indium phosphide, silicon germanium, aluminum gallium arsenide.

In an embodiment the substrate is a device substrate prepatterned with one or more device components.

In an embodiment, a thin film structure made by any of the methods disclosed herein is a fully coalesced thin film having a thickness less than or equal to 10 nm. In an embodiment, the thin film structure is a thin film having a root mean squared roughness less than or equal to 1 nanometer. In an aspect the thin film structure comprises a material selected from the group consisting of a metal, a metal oxide, a metal nitride or other material corresponding to the precursor gas.

Any of the methods provided herein are used to make a device, such as a device selected from the group consisting of an electronic device, an opto-electronic device, an optical device, a microelectromechanical system, and a nanoelectromechanical system.

In another embodiment, provided is a method of making a structure supported by a substrate by providing the substrate having a receiving surface and contacting the receiving surface of the substrate with a flux of metastable species. The kinetic energies and compositions of the metastable species are selected to substantially avoid etching or sputtering of the receiving surface and to substantially avoid incorporation of the metastable species into the substrate, thereby generating a treated receiving surface. Contacting the treated receiving surface with a deposition gas provides the structure supported by the substrate. In an aspect, any of the methods are used to make a structure that is a thin-film.

In an embodiment, any of the methods provide a flux of metastable species that is user-selectable, or a flux of metastable species that exposes the receiving surface to a current less than or equal to about 50 nAmps $cm^{-2}$. In an aspect, the metastable species have kinetic energies less than or equal to 50 eV. In another aspect, the metastable species are electronically excited species, such as electronically excited noble gas atoms, electronically excited Ar atoms, electronically excited He atoms, electronically excited Ne atoms, or clusters or combinations of these. In an aspect, the metastable species are chemically inert.

Any of the methods disclosed herein relate to the receiving surface of the substrate that is contacted with the flux of metastable species for a duration, such as a duration selected over the range of 10 seconds to 10 minutes.

In an embodiment, any of the methods provided herein generate a flux of metastable species that provides a flux of radicals to the receiving surface less than or equal to a user-selected flux. Alternatively, the flux of metastable species provides a flux of ions to the receiving surface less than or equal to a user-selected flux.

In an aspect, the flux of metastable species is generated using a technique selected from the group consisting of a remote plasma, laser excitation, or other process as known in the art.

In an embodiment, the step of contacting the receiving surface of the substrate with the flux of metastable species generates a plurality of nucleation sites on the received surface of the substrate. In an embodiment, the step of contacting the receiving surface of the substrate with the flux of metastable species and/or other species output from the remote plasma makes at least a portion of the receiving surface atomically clean. In an embodiment, the step of contacting the receiving surface of the substrate with the flux of metastable species dehydrogenates at least a portion of the received surface of the substrate.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION OF THE INVENTION

"Structure" is used broadly herein to refer to deposition of a material on a substrate. The material may spatially vary over the surface of the substrate or may optionally be relatively uniform over the surface and correspond to a structure that is a layer or film supported by a substrate. "Film" refers to a conformal coating layer of a surface. Film or thin film refers to a layer that comprises a coating of atoms, molecules or ions or mixtures and/or clusters thereof. Thin film layers may comprise a single-layer having a substantially constant composition, a single layer having a composition which varies as a function of physical thickness or a plurality of thin films layers. Thin film layers include but are not limited dielectric materials, semiconductors, conducting materials, organic materials such as polymers and any combinations of these materials. In an embodiment, reference to thin dielectric layers includes but is not limited to metal oxide, metalloid oxide and salt thin films. Metal oxides, metalloid oxides and salts useable herein include, but are not limited to, Ag, Au, $Ta_2O_5$, $SiO_2$, $HfO_2$, $TiO_2$, $MgF_2$, $AlO_2$, $CaF_2$, $Nb_2O_5$, glass or mixtures of these materials. Thin metalloid and metal layers include but are not limited to Si and Al. Thin film layers may have any size, shape, physical thickness or optical thickness suitable for a selected application. In an aspect a plurality of deposited structures may form a pattern of structures on the substrate.

"Substrate" refers to any surface upon which a structure is to be deposited. Examples include, but are not limited to, semiconductive substrates useful in the field of microelectronics such as integrated circuits (IC). Other suitable substrate materials include, but are not limited to, wafers, silicon and compositions containing silicon, glass substrates, low-k dielectric materials such as low-k polymeric dielectrics or organic-containing silicon dioxide or carbon-doped oxide (CDO) dielectric and other substrate materials known in the art of IC manufacture and as discussed in U.S. Pat. No. 6,605,549.

"Substantially avoid" refers to making the structure on the substrate in a manner that does not physically or chemically alter the substrate in a detectable or functional manner. For example, the deposition does not substantially etch or sputter the substrate's receiving surface as occurs in other processes known in the art. Although minor etching or sputtering may be a side-effect of the processes disclosed herein, providing appropriate low energy and composition output from a remote plasma or a metastable species provides substantially no etching or sputtering compared to conventional methods known in the art (see, e.g., U.S. Pat. Nos. 6,613,695; 7,056,835; 6,638,859; 7,202,166) that generally utilize higher energy or incompatible species that result in undue surface or substrate modifications.

Similarly, "substantially not incorporated" refers to a remote plasma output material that does not significantly alter the substrate or the receiving surface of the substrate in a measurable or quantifiable manner.

"Metastable species" refers to an excited state of a species, including atoms from inert gases, where the species is unstable and transient but relatively long-lived. In an embodiment, metastable species refer to electronically excited gas phase species. The particularly energy level of the metastable is not important, so long as the metastable does not reconfigure the substrate receiving surface to which the metastable is exposed. A metastable atom is likely to remain stable until interaction with the receiving surface, wherein the metastable mediates surface activation for receiving subsequent deposition to generate structures on the substrate.

"Nucleation sites" refers to regions on the receiving surface wherein a plurality of atoms of the material to-be-deposited cluster and promote further deposition. Processes disclosed herein can achieve relatively high density of nucleation sites. In an embodiment, the density of nucleation sites is greater than that provided using conventional CVD or ALD methods.

"Atomically clean" refers to a receiving surface that does not contain an additional layer of foreign atoms, such as foreign atoms that might be disadvantageous with regard to an electrical, optical and/or magnetic property of the system. The foreign atoms may be introduced from the surrounding environment, the remote plasma, or indirectly from the remote plasma and/or environment.

"Remote" refers to plasma generation in a region that is physically separated from where the receiving surface is located. The output from the remote plasma is then conveyed and exposed to the receiving surface.

"Passivated" or "passivating" refers to pre-processing a receiving surface by terminating surface bonds with hydrogen. One example of a passivating step is terminating silicon bonds with hydrogen by contacting the receiving surface with an acid, such as HF, followed by rinsing, such as rinsing with deionized water.

"Semiconductor" refers to any material that is an insulator at a very low temperature, but which has an appreciable electrical conductivity at a temperatures of about 300 Kelvin. In the present description, use of the term semiconductor is intended to be consistent with use of this term in the art of microelectronics and electronic devices. Semiconductors useful in the present invention may comprise element semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MOS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electronic properties useful for a given application or device. The term semiconductor includes composite materials comprising a mixture of semiconductors and/or dopants. Specific semiconductor materials useful in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP.

The deposition process may be selected as desired depending on the application, structure or thin layer composition and accordingly the composition of precursor molecules. Examples of deposition processes include, but are not limited to, chemical vapor deposition (CVD), atomic layer deposition (ALD), or other suitable deposition processes known in the art. For example, a silicon source can be used to deposit silicon-containing structures or thin films, for example silanes, monosilane, disilane, trisilane, DCS and TCS for deposition of poly-SiGe, silicon nitride metal silicides, and extrinsic or intrinsic silicon (polycrystalline, amorphous or epitaxial). Examples of deposition processes include, but are not limited to, CVD and ALD.

A thin film formed over the substrate by CVD or ALD, for example, is made of any material that is compatible with the specific deposition process. Examples of materials include, but are not limited to, those formed from low-k dielectric materials, such as low-k polymeric dielectrics or organic-containing silicon dioxide or carbon-doped oxide dielectric. For alternative integrated circuit device embodiments, the thin film layer may be formed from a high-k gate dielectric material such as aluminum oxide ($Al_2O_3$), tantalum pentoxide ($Ta_2O_5$), hafnium pentoxide ($Hf_2O_5$), etc. In another embodiment, the thin film may be formed from a high-k capacitor dielectric material such as $Ta_2O_5$, barium strontium titanate ($BaSrTiO_3$ or BST), etc.

The invention may be further understood by the following non-limiting examples. All references cited herein are hereby incorporated by reference to the extent not inconsistent with the disclosure herewith. Although the description herein contains many specificities, these should not be construed as limiting the scope of the invention but as merely providing illustrations of some of the presently preferred embodiments of the invention. For example, the scope of the invention should be determined by the appended claims and their equivalents, rather than by the examples given.

Example 1

Schematic and Overview of Enhanced Nucleation

Figure 1:
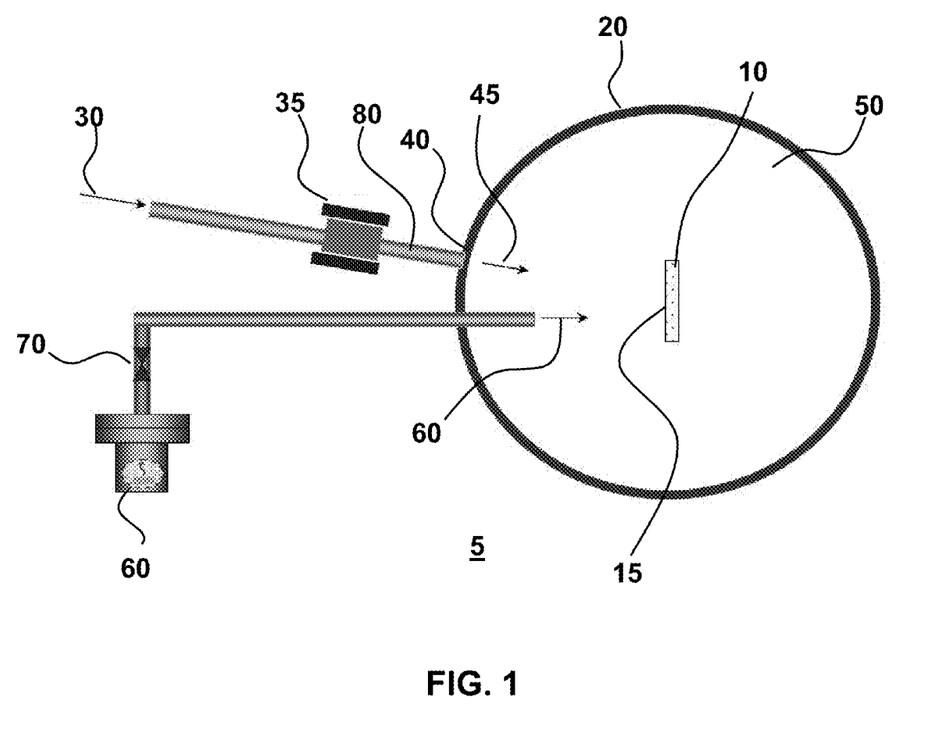
FIG. 1 Schematic of the growth reactor, showing the deposition chamber and plasma generation and dosing device location (not drawn to scale).

FIG. 1 is the schematic of a high vacuum reactor 5 used to generate high-quality thin films. The substrate 10 used in this example is silicon; prior to loading in chamber 20, it is dipped in dilute HF acid and rinsed with deionized water to passivate the surface by terminating the silicon bonds with hydrogen. This substrate 10 is then introduced via a load-lock into the reactor or chamber 20, which has been pumped to a base pressure of $10^{-8}$ Torr. The substrate is aligned with respect to a spectroscopic ellipsometer to observe changes in the optical properties of the film-on-substrate system during treatment and during film growth. The substrate is heated radiatively to 275° C. The ellipsometer data acquisition is turned on.

In a first set of experiments, Argon gas 30 flows into the chamber 20 through the remote plasma cavity orifice 40 downstream of the remote plasma generator 35. Conduit 80, such as a glass tube, conveys plasma from the plasma generator 35 to microcavity 50. In this example, the plasma is generated by a microwave plasma generator. Once the flow is stabilized, plasma is ignited in the cavity and the activated argon species, specifically a metastable atom 45, reaches the substrate 10. This treatment is continued for 10 min.; treatment time may be varied as desired, thereby varying the active site density on the receiving surface 15 of the substrate 10. After the treatment, the argon flow is closed and the plasma in the microcavity 50 is extinguished. Then the valve 70 which controls the CVD precursor 60 flow is opened and the precursor 60 is delivered to the substrate surface. In this example, the precursoer is $Hf[BH_4]_4$ The precursor partial pressure in the reactor during growth is $10^{-5}$ Torr. The time of precursor flow is monitored and a series of films is deposited with the same treatment procedure for each film but with different growth times (30 sec., 45 sec., 2 min., 4 min.). After film deposition, the substrate 10 is removed from the chamber 20 and is analyzed by AFM, SEM, XPS, and other microanalytical techniques to provide qualitative and quantitative analysis of film quality.

In a second set of experiments, another series of films is deposited but no treatment is done, i.e. the substrate does not receive activated argon species 45. The films are grown for various times (30 sec., 1 min., 2 min., 7 min.) and analyzed as before.

In a third experiment, the treatment is maintained during film growth, i.e. the remote plasma treatment of metastables 45 is continued during delivery of the precursor 60, so as to observe the possible effect of low energy plasma species on the growth of the thin film. No change in the film growth rate is observed relative to films grown using the treatment but with no plasma exposure during film growth. This indicates that dominant effect of the low energy plasma species is to activate the substrate surface for better nucleation in the early stages of film growth.

Figure 2A:
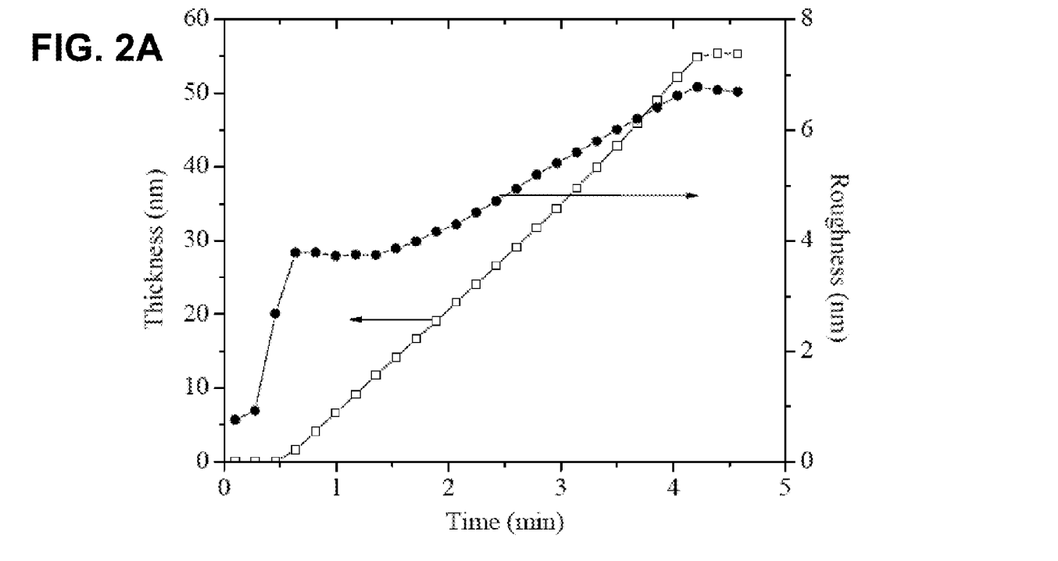
FIG. 2 Ellipsometry results showing (a) no nucleation delay with treatment and (b) a nucleation delay without treatment.
Figure 2B:
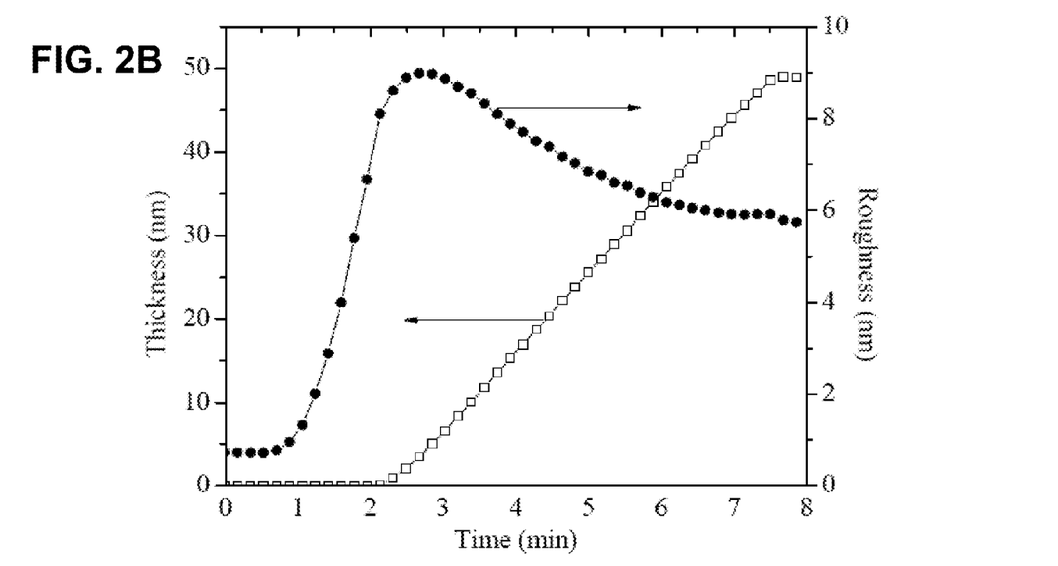

FIG. 2 shows the thickness and roughness data acquired during 4 min. of growth of treated sample (FIG. 2A) and 6 min. of growth of untreated sample (FIG. 2B). Note that the roughness data obtained by ellipsometry is always higher than the AFM data due to the standard assumptions used in the optical theory; however, the roughness measured by ellipsometry scales with the that measured by AFM. The time in between the flow of precursor to the first observed change in roughness value (the onset of growth) is identified as the nucleation delay. In FIG. 2A, there is almost no observable nucleation delay for the treated sample. However, for the untreated sample, the nucleation delay is slightly over 30 sec. The ellipsometry data also reveal, for both the samples, a maximum in the roughness, after which the roughness falls. The point where the roughness just starts to fall after the maxima corresponds to a fully coalesced film, as verified by XPS. In FIGS. 2A and 2B, the thickness for the treated sample at the point of coalescence is below 5 nm, whereas for the untreated sample the thickness is greater than 10 nm. This indicates that the treatment procedure can access ultra-thin fully coalesced films as compared to samples grown without treatment.

Figure 3A:
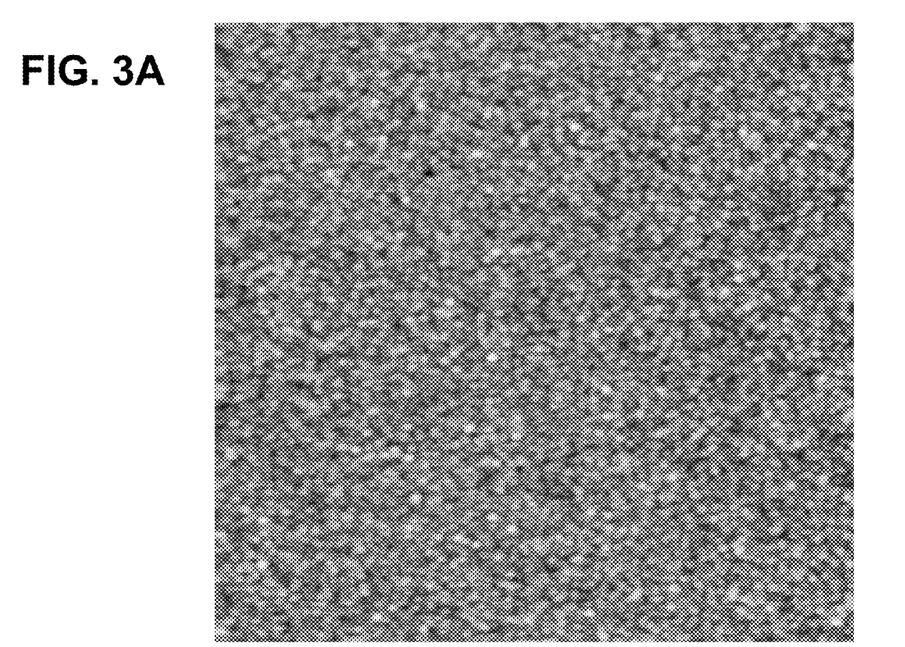
FIG. 3 AFM image of films deposited for 30 sec. without (A) and with (B) treatment, showing the nucleation density enhancement for the latter.
Figure 3B:
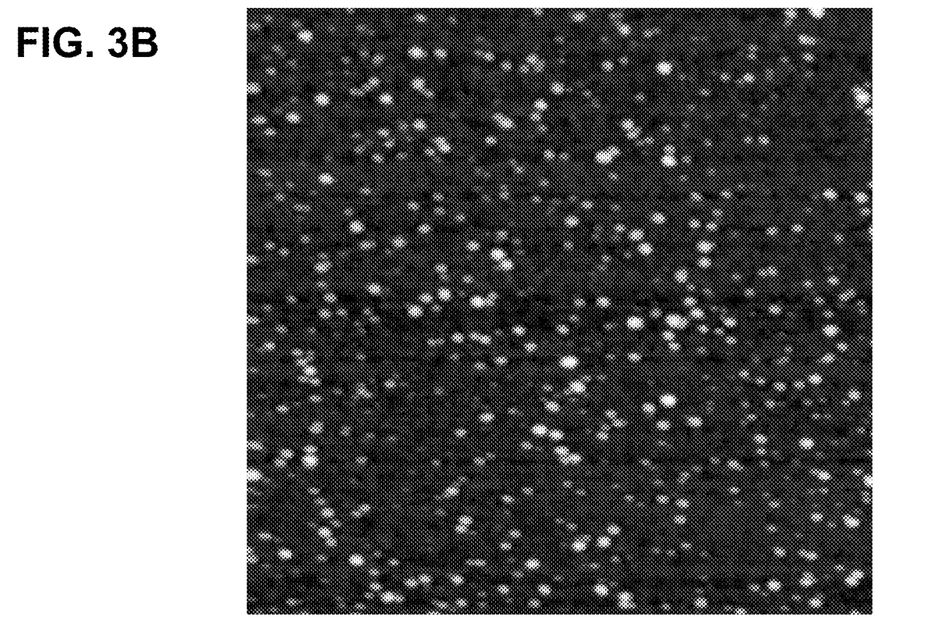
Figure 4A:
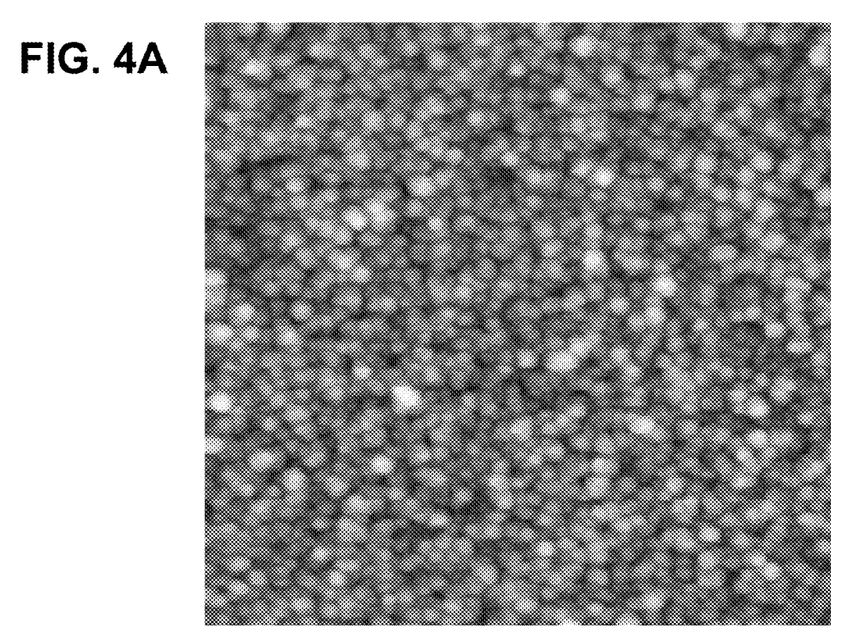
FIG. 4 AFM image of fully coalesced films without (A) and with (B) treatment.
Figure 4B:
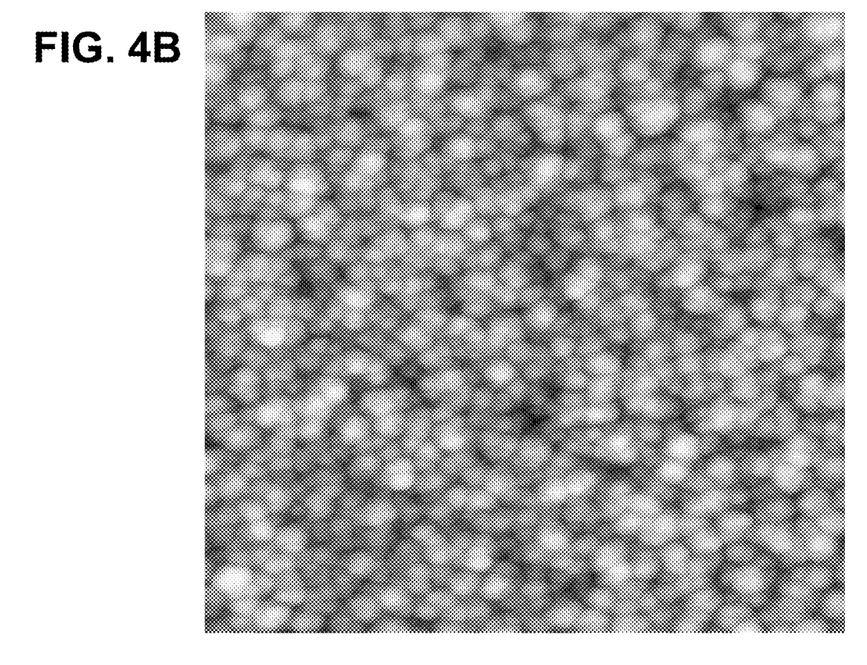

AFM images (1 μm×1 μm) in FIG. 3 indicate there is a significant increase in nucleation density and decrease in roughness due to the pre-treatment procedure. FIG. 3A is a treated sample with 30 sec. of film growth; FIG. 3B is without pre-treatment for the same film growth time. The effect of treatment is evident by dense nucleation as compared to sparse nucleation without the treatment. FIGS. 4A and 4B shows AFM images of 50 nm film grown with and without treatment, respectively. The treated sample has RMS roughness of 1.8 nm, whereas in the untreated experiment for the same thickness, the RMS roughness value is 2.8 nm. This is further illustrated in SEM micrographs of the same two films. The treated substrate affords a smoother film than the untreated one.

This experiment illustrates that treatment of silicon surface followed by the growth of $HfB_2$ from $Hf(BH_4)_4$ provides a higher quality thin-film that is smoother and has more uniform deposition than processes that do not treat. This process is compatible for a wide variety of CVD or ALD precursor molecules and substrate combinations where a nucleation problem exists. The systems and processes provided herein are capable of accessing lowest thickness (e.g., <5 nm) for a fully coalesced metal film by CVD with low roughness values that are not readily achievable with relatively low temperature processing conditions and conventional thin layer deposition processes.

The processes provided herein rely on surface activation to create nucleation sites, without sputtering or etching the surface. Exposure of the surface to noble gas species (e.g., metastable noble gas atoms) generated by low energy plasma species is a very gentle yet efficient way of enhancing nucleation on any surface. This treatment is a powerful way to enhance the nucleation density and thus to achieve fast coalescence and the growth of ultra-thin and ultra-smooth films. The treatment process is easy to implement and does not require any temperature changes relative to the film growth temperature.

Example 2

Nucleation Enhancement During Thin Film Deposition

The requirement for ultra thin films in microelectronics and other applications in nanotechnology has made nucleation one of the primary focuses in thin film deposition.[1] Dense nucleation and fast coalescence enables deposition of pinhole free ultra-thin smooth film. In CVD and ALD, two commonly used techniques for thin film deposition, nuclei are formed in selected sites on the substrate surface after which they grow and coalesce.[2,3] With fewer of these nucleation sites, corresponding island sizes are larger and the time for fully-coalesced films increases. In such situations it is almost inevitable to get high roughness values with higher thicknesses before a fully coalesced film is formed. It is therefore imperative to have high nucleation density on the substrate surface, to grow fully coalesced ultra-thin films with low roughness values. Prior techniques of nucleation enhancement have been system (substrate, precursor) specific; relying on surface activation by chemically etching the surface to create active sites for nucleation or by altering surface termination to aid the adsorption of one or more of the precursors during ALD.[4,5] Although effective, this approach can bring undesirable changes to the film substrate interface.

We present a novel technique to enhance nucleation, without damaging the substrate, in a CVD/ALD system which is fully compatible with current silicon technology. It relies on activating the substrate surface with noble gas species coming from microwave plasma and/or high energy electromagnetic radiation generated outside the deposition chamber. The interaction of these noble gas species and/or high energy electromagnetic radiation with the substrate creates dangling bonds on it. These dangling bonds serve as active sites for nucleation. We demonstrate this nucleation enhancement on silicon substrate for two systems: one a single precursor CVD of metallic $HfB_2$ and another CVD of MgO using a magnesium precursor and water as a co-reactant.

The silicon substrate (100) is prepared by degreasing in an ultrasonic bath using standard organic solvents and rinsing in DI water. Prior to its introduction in the chamber, it is dipped in a HF solution and rinsed with DI water to achieve a hydrogen terminated silicon surface.[6] The treatment and CVD is done in a UHV chamber pumped to a base pressure of $10^{-9}$ Torr. The precursor delivery and deposition chamber details are described elsewhere.[7] The remote plasma is generated using an Evenson microwave cavity operated at 2.45 GHz which has been described by Fehsenfeld et al.[8] Inside the cavity the electromagnetic fields generate an oversaturated plasma region which is characterized by a high electron density and electron temperatures not higher than 5 eV. Outside the cavity the electromagnetic fields sharply decrease and so does electron and ion densities.[9] For this reason, Evenson cavities have been extensively used in the literature as atomic and radical sources.

The plasma treatment is optionally performed by exposing the silicon surface to downstream flow of argon coming from the microwave plasma. In this example, two specific plasma treatments of the substrate surface are investigated: treatment A where the remote plasma is on just before treatment (treatment); and treatment B where plasma is on during treatment and throughout the nucleation stage. The effectiveness of one of these treatments over the other depends on the CVD system (precursor substrate combination). In both the treatments A and B, the growth rate is not affected in the presence of argon species exposure during growth. This suggests that the surface activation takes place only on bare silicon substrate and the argon species does not affect the steady state film growth. The nucleation and growth of deposited films are monitored in situ using spectroscopic ellipsometry. Ex situ roughness analysis of the film is carried out by tapping mode AFM and film microstructure determined by Field Emission SEM.

Figure 5A:
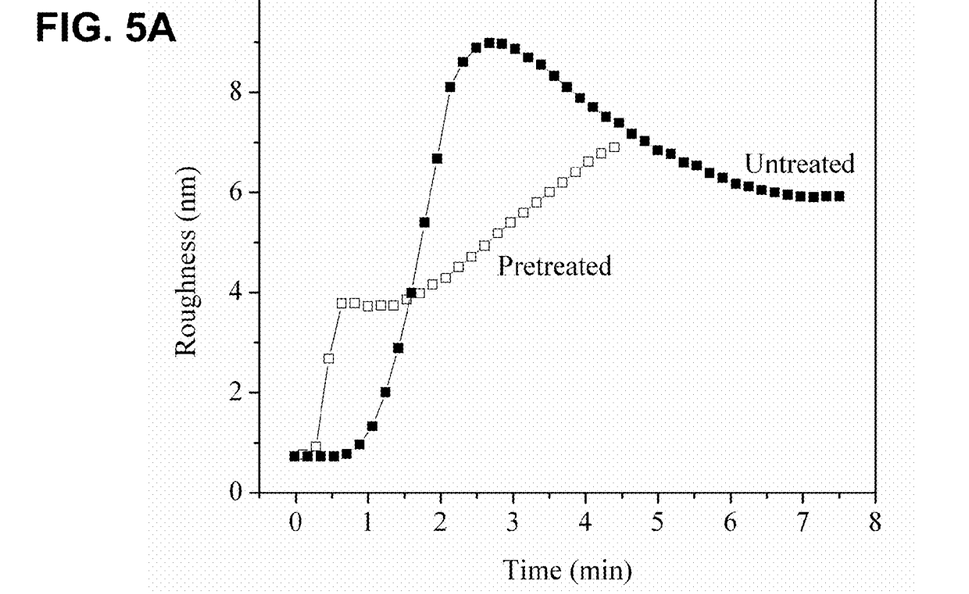
FIG. 5 (a) Ellipsometry Roughness and (b) AFM calculated RMS roughness evolution vs. time of untreated and plasma treated $HfB_2$ films.
Figure 5B:
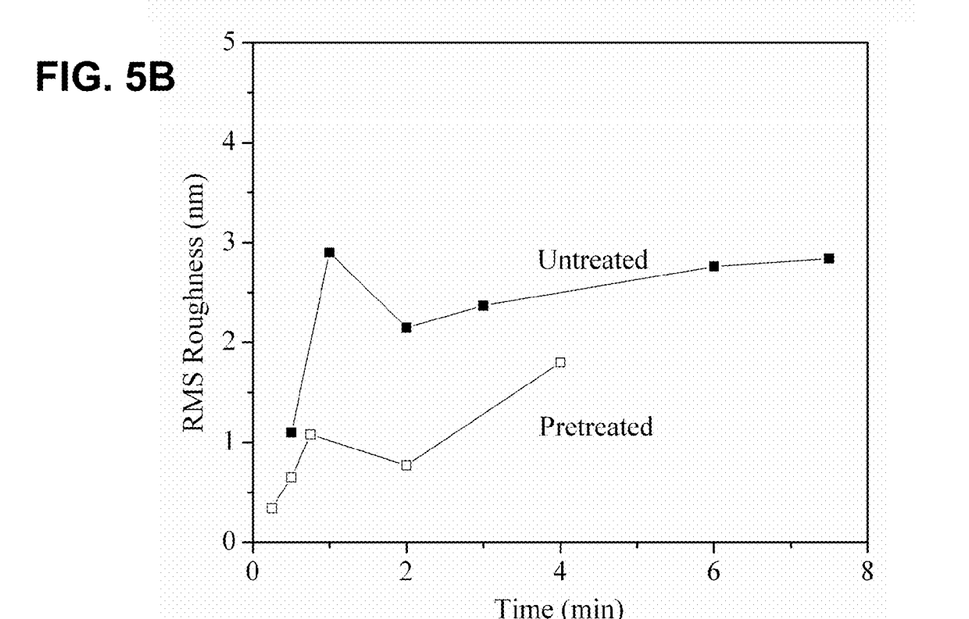
Figure 6A:
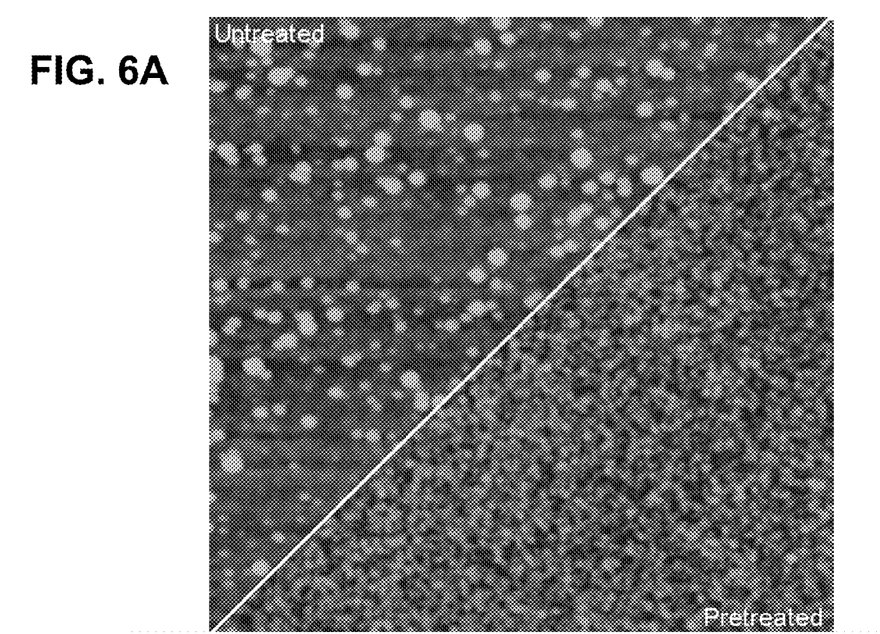
FIG. 6 (a) Diagonal insets of Tapping mode AFM images and (b) the height distribution function of 30 seconds grown untreated and treated $HfB_2$ films respectively.
Figure 6B:
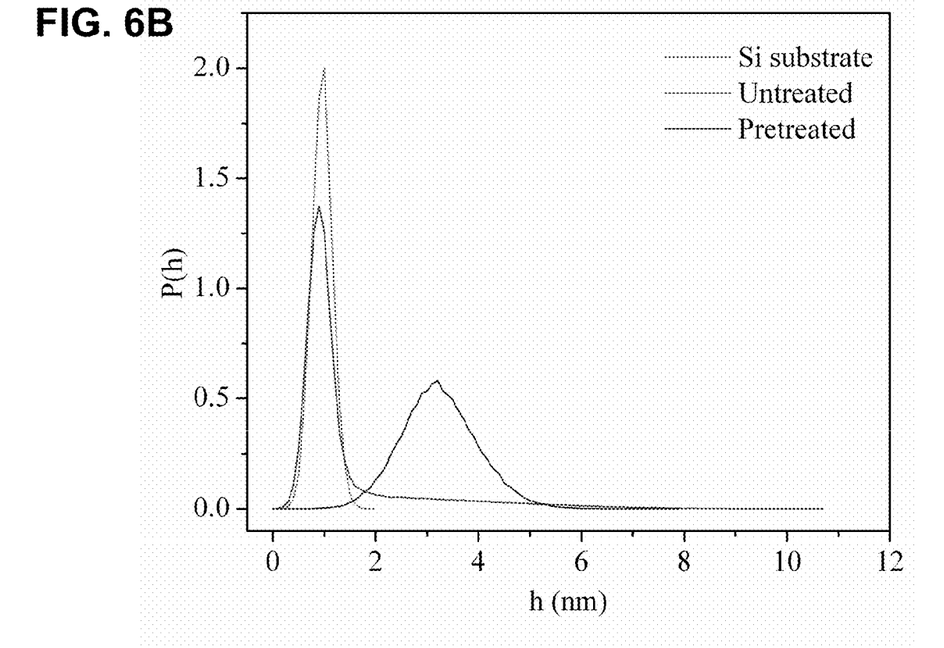
Figure 7:
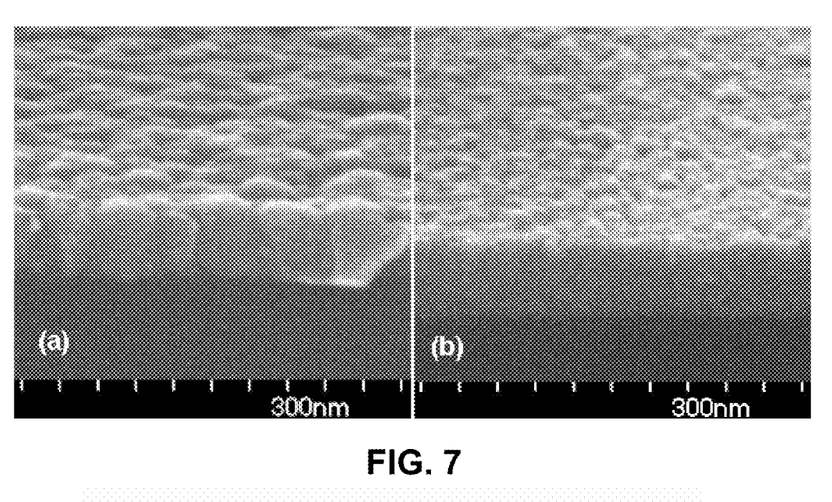
FIG. 7 Field Emission-SEM micrographs of 50 nm thick $HfB_2$ films grown under untreated (A) and plasma-treated (B) conditions.

FIG. 5 shows the effect of 10 mins of treatment A on the nucleation and growth of 50 nm of $HfB_2$ films using $Hf(BH_4)_4$ as monitored by in-situ ellipsometry and ex-situ AFM. The details of CVD and the ellipsometric modeling of $HfB_2$ thin films (with interpretations of nucleation, coalescence and growth) using this precursor have been reported.[10] In both the untreated and treated runs, the substrate temperature is fixed to 275° C. and precursor pressure regulated to about $10^{-5}$ Torr using a needle valve. The growth is carried out in both cases to get a final thickness of 50 nm. The untreated sample (FIG. 5A) shows 45 seconds of nucleation delay (time from the start of precursor flow to first observed change in optical data of the system) whereas the treated sample shows almost no nucleation delay. The fall in the value of roughness after the initial rise is indicative of coalescence of islands formed during nucleation. As is evident from FIG. 5A, the treated sample takes lesser time to coalesce and can afford fully coalesced films at much lower thickness than the untreated sample. XPS done on the sample ex-situ has confirmed the coalescence of the treated films after 45 sec. of precursor flow. The overall roughness of the films measured by ellipsometry is lower for the treated samples than the untreated ones. The AFM measured RMS roughness evolution with time (FIG. 5B) shows trends similar to ellipsometry measured roughness for the treated and untreated samples. The overall RMS roughness remains lower for treated samples as compared with the untreated ones. One important point that should be kept in mind is that for the same thickness, the film roughness measured by AFM (RMS Roughness) is always less but differs systematically from that estimated by EMA layer roughness from ellipsometry.[11] The effect of plasma treatment on nucleation enhancement is highly evident from AFM images (FIG. 6A) where the untreated sample shows a meager number of nuclei after 30 sec. exposure to the growth precursor whereas, the treated sample is densely covered with nuclei. The height distribution function P(h) (FIG. 6B) elegantly elaborates the difference in nucleation characteristics of the treated and untreated samples. The substrate, the untreated 30 sec. grown film and treated 30 sec grown films have different P(h). The P(h) of 30 sec grown film shows contribution from the substrate P(h) and a broad film P(h) with a long tail extending towards higher height values. This suggests that the nucleation is sparse enough to see both the substrate and the film height distributions. Also, there is a large variation in heights of nuclei as evident from the long tail in P(h). For the treated substrate, P(h) contribution of the substrate is vanished and the distribution is narrower implying that the heights of nuclei does not as much as in untreated case. Thus, the plasma treatment technique proves to be highly effective in enhancing nucleation. The effect of nucleation enhancement is also evident in the later stages of growth. As shown in SEM cross-sectional micrographs of a 50 nm $HfB_2$ film in FIG. 7, the untreated sample (a) have large bumpy features on the surface whereas the treated sample (b) has a less bumpy surface.

Figure 8:
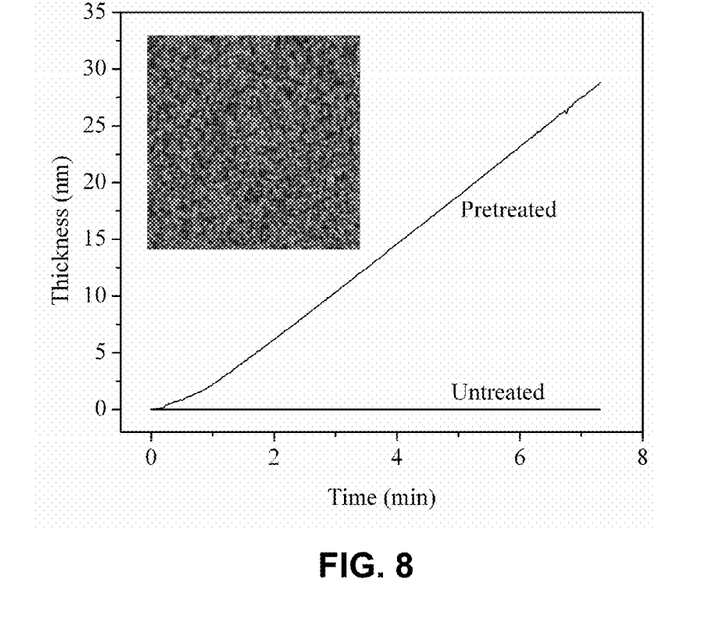
FIG. 8 Thickness evolution obtained by in-situ ellipsometry of MgO film grown under untreated and plasma treated conditions (inset: 30 nm thick MgO film grown under treated plasma treated conditions)

We demonstrate the effectiveness of the treatment B on another CVD system, that of MgO using $Mg(DMDBA)_2$ and water as the co-reactant. Ellipsometry shows that the film does not nucleate at all in absence of treatment on hydrogen terminated silicon surface at 275° C., whereas, the steady state growth rate is known to be 4 nm/min for the same experimental condition (FIG. 8). Treatment B offers fast nucleation with no nucleation delay. This is evident from the roughness value obtained from ellipsometry model which remains almost negligible suggesting the occurrence of very fast nucleation and coalescence in the treated samples. The results agree with the AFM measurements which show very small feature sizes and where the RMS roughness is 0.35 nm for a 10 nm film and 0.5 nm for a 30 nm film.

In some embodiments, the surface treatment process relies on the interaction between species generated from microwave argon plasma and the hydrogen terminated silicon surface. From the plasma point of view, there are four different species that are potentially relevant for the nucleation enhancement process: electrons, ions, metastables and UV photons, all of which are characterized by energies below 20 eV in the case of Ar-based remote plasma generation. Given the nature of the discharge and the absence of accelerating voltages, the ion and electron flows in the downstream region are very small. This is one of the reasons why these discharges have been used as atomic sources. Not only is there a fast decay in the electron density outside the cavity region, but also the high neutralization probability with the walls contribute to a fast depletion in the number of charged species in the absence of any DC accelerating potential. This is in agreement with the low current (50 nA) measured by grounded electric probe placed in the position of the substrate holder. Also, the floating potential measured using this probe is 0.42 V which corresponds to electron energy of 0.2 eV. This energy is at least an order of magnitude lower for known threshold of electron stimulated desorption (ESD).[12] However, contrary to the case of charged particles, which recombine readily in the tube walls, the reflection coefficient of Ar metastable in pyrex is 0.28 according to the experimental measurements by Macko and Sadeghi.[13] In our experimental conditions, we have determined that the mean free path for both metastables levels is greater than 10 m using the rate coefficients provided by Bultet et al.[14] This means that an important flow of metastable atoms is expected in the substrate holder.

Regarding photon emission, in Ar plasmas there are four important contributions: two of them, the 4p-4s transitions are in the 700 nm region and 5p-4s transitions in the 400 nm region, have energies which are lower than the typical Si—H bond energy. Also, there are two sources in the VUV region, the $Ar_2^*$ excimer emission, which takes place at 210 nm, and the 3s2p5 4s 3P3 and 3P1 resonant transitions to the Ar ground state, characterized by photon energies of 11.624 and 11.828 eV, respectively.[15] The interaction of UV photons with hydrogen terminated silicon surface is reported in the literature. UV photons can desorb hydrogen from silicon surfaces by two mechanisms: photothermal for lower photon energies (~4 eV threshold) and photochemical for higher photon energies (7.9 eV threshold).[16] This supports identification of the active species responsible for surface activation as the argon metastables and UV radiation coming from the plasma.

The interaction of metastables with metal surfaces has also been studied thoroughly.[17,18] Metastables can interact with a surface in two ways: one in which Resonance Ionization (RI) of these metastables takes place followed by its Auger neutralization by an electron emitted from the surface and another in which the metastables can undergo Auger de-excitation (AD) in which it loses an electron from higher energy state and gains one from the surface into a low energy state. This creates a hole on the valence band of the surface, thereby enhancing the probability of desorption of a species from the surface, provided the energy requirements for desorption are met. Mitsunori et al.[19] first showed the desorption of H from hydrogen terminated alkali metal surface and later Yamauchi et al.[20] demonstrated the desorption of hydrogen from hydrogen terminated Si (111) surface using pulsed DC He plasma. They used TOF measurements to prove that in their experimental conditions He metastables and not photons are responsible for hydrogen desorption from Si—H surface. However, the exact mechanism of hydrogen desorption by metastables from a silicon surface is not fully understood.

In our system, both UV photons and metastables generated from the plasma have sufficient energy to desorb hydrogen from the silicon surface, but low enough energy to avoid undesired interactions. Without being bound or limited to any ultimate underlying mechanism, Applicants believe the processes provided herein facilitates hydrogen desorption during surface treatment to create dangling bonds which remain frozen at low temperatures that function as active sites for nucleation. In some CVD systems, hydrogen coming off the substrate surface as a reaction byproduct may re-passivate the dangling bonds produced by the plasma treatment. In such systems, it is therefore advantageous to follow treatment B, where the plasma is kept on throughout nucleation, so as to continuously create new sites for precursor adsorption. Similar surface activation by hydrogen desorption from Si surface using an STM tip has been reported, where the desorbed site offered the possibility of selective deposition during CVD.[21]

The processes provided herein facilitate nucleation enhancement for other precursor substrate combinations during CVD or ALD, fully compatible with current silicon technology and with zero thermal budget.

REFERENCES 1 www.itrs.net, (International Technology Roadmap for Semiconductors, 2007).
2 Y. Kajikawa and S. Noda, Applied Surface Science 245 (1-4), 281-289 (2005).
3 R. L. Puurunen and W. Vandervorst, Journal of Applied Physics 96 (12), 7686-7695 (2004).
4 Christophe F. Pomarede, Jeff Roberts, and Eric J. Shero, U.S. Pat. No. 6,613,695 B2 (Sep. 2 2003).
5 Ofer Sneh, Thomas E. Seidel, and Carl Galewski, U.S. Pat. No. 6,638,859 B2 (Oct. 28 2003).
6 H. F. Okorn-Schmidt, ibm Journal of Research and Development 43 (3), 351-365 (1999).
7 S. Jayaraman, E. J. Klein, Y. Yang et al., Journal of Vacuum Science & Technology A 23 (4), 631-633 (2005).
8 F. C. Fehsenfeld, K. M. Evenson, and H. P. Broida, Review of Scientific Instruments 36 (3), 294-298 (1965).
9 M. Moisan, Z. Zakrzewski, and R. Pantel, Journal of Physics D-Applied Physics 12 (2), 219-& (1979).
10 Y. Yang, S. Jayaraman, B. Sperling et al., Journal of Vacuum Science & Technology A 25 (1), 200-206 (2007).
11 J. Koh, Y. W. Lu, C. R. Wronski et al., Applied Physics Letters 69 (9), 1297-1299 (1996).
12 T. C. Shen and P. Avouris, Surface Science 390 (1-3), 35-44 (1997).
13 P. Macko and N. Sadeghi, Plasma Sources Science & Technology 13 (2), 303-308 (2004).
14 A. Bultel, B. van Ootegem, A. Bourdon et al., Physical Review E 65 (4) (2002).
15 S. Neeser, T. Kunz, and H. Langhoff, Journal of Physics D-Applied Physics 30 (10), 1489-1498 (1997).
16 A. Pusel and P. Hess, Surface Science 435, 74-78 (1999).
17 W. Sesselmann, B. Woratschek, J. Kuppers et al., Physical Review B 35 (4), 1547-1559 (1987).
18 W. Sesselmann, H. Conrad, G. Ertl et al., Physical Review Letters 50 (6), 446-450 (1983).
19 M. Kurahashi and Y. Yamauchi, Surface Science 454, 300-304 (2000).
20 Y. Yamauchi, X. Ju, T. Suzuki et al., Surface Science 528 (1-3), 91-96 (2003).
21 T. Mitsui, R. Curtis, and E. Ganz, Journal of Applied Physics 86 (3), 1676-1679 (1999).

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting material, reagents, synthetic methods, purification methods, analytical methods and compositions other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method of making a structure supported by a substrate, said method comprising the steps:
  a. providing said substrate having a receiving surface;
  b. exposing at least a portion of said receiving surface of said substrate to output from a remote plasma of an inert gas, said remote plasma having an energy low enough to substantially avoid etching or sputtering of said receiving surface; wherein the output of said remote plasma exposes said receiving surface to a current less than or equal to 70 nAmps cm$^{-2}$ thereby generating a treated receiving surface; and
  c. contacting said treated receiving surface with a deposition gas; thereby making said structure supported by said substrate.

2. The method of claim 1 wherein said structure is a thin film.

3. The method of claim 1 wherein said remote plasma is a noble gas plasma.

4. The method of claim 1 wherein said remote plasma is a plasma of He gas, Ar gas, Ne gas, Kr gas, Xe, gas or a combination of these gases.

5. The method of claim 1 wherein said remote plasma has an energy less than or equal to 30 eV.

6. The method of claim 1 wherein said remote plasma has an energy selected over the range of 1 eV to 50 eV and provides an electron energy incident with said receiving surface that is less than 0.3 eV.

7. The method of claim 1 wherein said remote plasma has an energy low enough such that said output of said remote plasma is substantially not incorporated into said substrate upon said exposing step.

8. The method of claim 1 further comprising the step of removing electrons, ions or both from said output of said remote plasma.

9. The method of claim 8 wherein said step of removing electrons, ions or both from said output of said remote plasma is achieved by contacting said output with a surface capable of scavenging said electrons, ions or both prior to exposure of said output to said receiving surface.

10. The method of claim 1 wherein said output from said remote plasma provides a flux of metastable species to said receiving surface of said substrate.

11. The method of claim 10 wherein said metastable species comprises excited species.

12. The method of claim 10 wherein said metastable species comprise electronically excited species.

13. The method of claim 12 wherein said electronically excited species are electronically excited Ar atoms, electronically excited He atoms, electronically excited Ne atoms, or clusters or combinations of these.

14. The method of claim 1 wherein said receiving surface of said substrate is exposed to said output of said remote plasma for a duration selected over the range of 10 seconds to 10 minutes.

15. The method of claim 1 wherein said substrate is provided in a deposition chamber; and wherein said remote plasma is provided outside of said deposition chamber.

16. The method of claim 15 wherein said output of said plasma is provided to said deposition chamber via a glass tube.

17. The method of claim 1 wherein said step of exposing at least a portion of said receiving surface of said substrate to output from said remote plasma generates a plurality of nucleation sites on said received surface of said substrate.

18. The method of claim 1 wherein said step of exposing at least a portion of said receiving surface of said substrate to output from said remote plasma makes at least a portion of said receiving surface atomically clean.

19. The method of claim 1 wherein said step of exposing at least a portion of said receiving surface of said substrate to output from said remote plasma dehydrogenates at least a portion of said received surface of said substrate.

20. The method of claim 1 further comprising the step of passivating said receiving surface of said substrate prior to said exposing step.

21. The method of claim 20 wherein said passivating step comprises the steps of:
  a. contacting said receiving surface with HF acid; and
  b. rinsing said receiving surface with deionized water.

22. The method of claim 1 wherein said deposition gas is a chemical vapor deposition precursor gas or an atomic layer deposition precursor gas.

23. The method of claim 1 wherein said deposition gas is one or more compounds selected from the group consisting of $HF(BH_4)_4$, transition metal, f-metal, and main group compounds bearing ligands that are hydrides, borohydrides, halides, oxides, alkoxides, hydroxides, beta-diketonates, carboxylates, siloxides, thiolates, sulfides, nitrides, amides, imides, beta-diketiminates, pyrazolates, trazolates, amidinates, nitrites, nitrates, azides, alkyls, aryls, cyclopentadienyls, ethers, sulfides, ketones, aldehydes, amines, nitriles, isonitriles, phosphines, phosphites, arsines, stibines, carbonyls, olefins, alkynes, arenes, and cyclooctatetraenes.

24. The method of claim 1 wherein said substrate is a semiconductor substrate.

25. The method of claim 1 wherein said substrate comprises a semiconductor material selected from the group consisting of silicon, germanium, gallium arsenide, indium phosphide, silicon germanium and aluminium gallium arsenide.

26. The method of claim 1 wherein said substrate is a device substrate prepatterned with one or more device components.

27. The method of claim 2 wherein said thin film structure is a fully coalesced thin film having a thickness less than or equal to 10 nm.

28. The method of claim 2 wherein said thin film structure is a thin film having a root mean squared roughness less than or equal to 1 nanometer.

29. The method of claim 2 wherein said thin film structure comprises a material selected from the group consisting of a metal, a metal oxide and a metal nitride.

30. The method of claim 1 comprising a method for making a device selected from the group consisting of: an electronic device, an opto-electronic device, an optical device, a microelectromechanical system, and a nanoelectromechanical system.

31. A method of activating a substrate surface, said method comprising the steps:
  a. providing said substrate having a receiving surface; and
  b. exposing at least a portion of said receiving surface of said substrate to output from a remote plasma of an inert gas, said remote plasma having an energy low enough to substantially avoid etching or sputtering of said receiving surface; wherein the output of said remote plasma exposes said receiving surface to a current less than or equal to 70 nAmps $cm^{-2}$ thereby generating a treated receiving surface.

* * * * *